United States Patent
Ikeda (10) Patent No.: US 7,253,444 B2
(45) Date of Patent: Aug. 7, 2007

(54) SILICONE-FILLED CASING FOR USE WITH LIGHT-EMITTING UNIT AND METHOD OF MANUFACTURING THE LIGHT-EMITTING UNIT

(75) Inventor: Minoru Ikeda, Tokyo (JP)

(73) Assignee: Toki Corporation, Tokyo (JP)

( * ) Notice: Subject to any disclaimer, the term of this patent is extended or adjusted under 35 U.S.C. 154(b) by 605 days.

(21) Appl. No.: 10/780,764

(22) Filed: Feb. 19, 2004

(65) Prior Publication Data

US 2005/0139850 A1 Jun. 30, 2005

(30) Foreign Application Priority Data

Dec. 26, 2003 (JP) ............... 2003-435748

(51) Int. Cl.
*H01L 27/15* (2006.01)
(52) U.S. Cl. ............ 257/81; 257/99; 257/100; 257/E33.075; 257/E51.02; 438/22
(58) Field of Classification Search ............ 257/81, 257/E33.075, E33.07
See application file for complete search history.

(56) References Cited

U.S. PATENT DOCUMENTS

2004/0069998 A1* 4/2004 Harazono ............ 257/81
2004/0075100 A1* 4/2004 Bogner et al. ............ 257/99
2004/0126913 A1* 7/2004 Loh ............ 438/26
2006/0054901 A1* 3/2006 Shoji et al. ............ 257/80

FOREIGN PATENT DOCUMENTS

JP 2003-59335 2/2003

* cited by examiner

*Primary Examiner*—Leonardo Andujar
*Assistant Examiner*—Krista Soderholm (57) ABSTRACT

A light-emitting unit containing a substrate and light emitting diodes (LEDs) is housed inside a casing constituted by a first member and a second member which are joined together. The second member has a projecting piece which is inserted to the first member, and inside the projecting piece a passage is formed. When silicone is injected through an injection opening from an injector, the silicone starting from the projecting piece flows through in the order of the passage, first-member side space, connecting passage and second-member side space and it finally overflows from a discharge opening. By implementing this structure and process, the air or air bubbles inside the light-emitting unit is pushed outside completely.

16 Claims, 9 Drawing Sheets

SILICONE-FILLED CASING FOR USE WITH LIGHT-EMITTING UNIT AND METHOD OF MANUFACTURING THE LIGHT-EMITTING UNIT

BACKGROUND OF THE INVENTION

1. Field of the Invention

The present invention relates to casings for use with light-emitting units and a method of manufacturing the light-emitting units, and it particularly relates to a technology by which to form the light-emitting unit having a high performance capability of thermal emission.

2. Description of the Related Art

Conventionally, illuminators using light-emitting devices, such as LEDs (light emitting diodes), have been provided with some waterproofing arrangement to enable outdoor installation. Among such waterproofing methods, a technique for filling the casing, or enclosure, with transparent resin is known (see, for example, Reference (1) in the following Related Art List).

Related Art List (1) Japanese Patent Application Laid-Open No. 2003-059335.

However, when such resin liquid is injected into the casing through a hole made therein, air bubbles tend to form in the liquid resin, which may deprive the material of necessary thermal conductivity. Furthermore, such air bubbles showing on the surface would give a poor appearance to the product and an impression of low product reliability. To remove the air bubbles, additional processes are required, thus making the manufacturing of the illuminator more complex and consequently raising the unit cost of the product.

SUMMARY OF THE INVENTION

The present invention has been made in view of the foregoing circumstances and an object thereof is to provide a casing, for use with light-emitting unit, which shows excellent heat release performance and a method of manufacturing such light-emitting unit.

In order to solve the above problems, according to a preferred embodiment of the present invention there is provided a casing, for use with light-emitting unit, which covers and contains therein a substrate with light emitting elements mounted thereon. The casing is constituted by a first member and a second member which fixedly hold the substrate therebetween and which are approximately dish-shaped and are joined together in a mutually engaged manner such that a hollow area in which the substrate is disposed is formed therebetween, wherein the second member has a projecting piece inserted to the first member and inside the projecting piece there is formed a passage that penetrates from near a top thereof to a bottom thereof so as to communicate the hollow area with the outside of the casing, wherein at a position where the passage is connected to the outside of the casing there is formed an injection opening to inject fluid material, which changes to a solidified state, to the hollow area via the passage, wherein in the vicinity of the injection opening there is provided a discharge opening to discharge the injected fluid material from the hollow area, wherein, in a state where the second member and the first member are being joined together and mutually engaged therewith, the hollow area is divided into a first-member side space and a second-member side space with the substrate as a boundary therebetween, and a tip of the projecting piece is disposed in the first-member side space whereas the discharge opening is disposed near the second-member side space, and wherein the hollow area is formed in a shape such that the fluid material injected from the injection opening flows from the first-member side space through the second-member side so as to be discharged from the discharge opening.

The "fluid material" may be fluid, such as silicone or the like, which changes from a viscous fluid state to a solidified state. The first member and the second member may be joined together and secured by screws or the like.

According to this embodiment, the fluid material flows through sequentially in the order of the injection opening, the passage, the first-member side space, the second-member side space and finally the discharge opening, so that the light-emitting unit is at all times completely filled with the fluid material leaving no space therebetween. Thereby, no air or air bubbles remains inside the light-emitting unit. Hence, the heat arising from light emitting elements and substrate is efficiently conducted and conveyed to the fluid material and the casing for use with light-emitting unit. Accordingly, the thermal release performance can be raised by a simple process and at low cost.

The first member is a member positioned in an upper side of the casing for use with light-emitting unit when in use and the first member may have a substantially transparent area through which light emitted from the light emitting element transmits. The second member is a member positioned in a back side of the casing for use with light-emitting unit when in use and the injection opening may be provided at a position not on the upper side thereof when in use. When the light-emitting unit is in use, the first member is disposed right above the second member. However, at the time of assembling the light-emitting unit and especially of injecting the fluid material into the casing for use with light-emitting unit, the second member may be disposed on the first member so that the second member is the topside. In that case, the injection opening and the discharge opening are so disposed that they are open on the topside, thus being suitable for the process of injecting the silicone.

There may be provided a concave or the like on an outer surface of the second member and there is provided a discharge opening in part of a bottom face of the concave. In such a case, the fluid material is injected and then the injection of the fluid material is stopped when the discharge of the fluid material starts. Then, a small amount of the fluid material that has overflowed from the discharge opening stays in the concave, and the fluid material does not drip out. Moreover, the material that overflows from the discharge opening can stay collected up to as much as volume corresponding to the concave, so that the amount of fluid material to be injected can be calculated in advance and controlled within an appropriate range. Moreover, the bottom face area of the concave is larger than the opening area of the discharge opening. Thus, it is easy to observe and monitor how the air bubbles float out of the hollow area if implemented is a structure such that the discharged fluid material is collected in the concave. Accordingly, no air or air bubbles remains inside the light-emitting unit and the thermal emission performance is raised.

The discharge opening may be formed in such a manner that an opening area of the discharge opening is larger than that of the injection opening. This structure facilitates smoother and faster movement of the fluid material in the direction from the injection opening toward the discharge opening and, together with the smooth and fast flow, facilitates discharging outside the air bubbles in the light-emitting unit. Thus, no air or air bubbles is allowed to remain inside the light-emitting unit, so that the thermal emission performance can be raised.

Another preferred embodiment according to the present invention relates to a method of manufacturing light-emitting units. This method includes: joining together a first member and a second member, of approximately dish-shapes, to be mutually engaged therewith in such a manner that a substrate on which a light emitting element is mounted is fixedly held therebetween and there is formed a hollow area in which the substrate is disposed therein; inserting an injector that injects fluid material, which changes to a solidified state, to an injection opening provided in the second member and connected to the hollow area; starting injection of the fluid material through the injection opening from the injector; filling a first-member side space and a second-member side space with the fluid material, where the hollow area is divided into the first-member side space and the second-member side space with the substrate as a boundary therebetween; and stopping injection of the fluid material when the fluid material filled up by the filling is discharged from a discharge opening provided on an outer surface of the second member and a concave provided in the periphery of the discharge opening on the outer surface of the second member becomes full of the fluid material.

When injecting the fluid material, the second member may be positioned so that it is disposed right above the first member. After stopping the injection of the fluid material, the whole unit may be left unattended at the still position until the fluid material solidifies.

According to this embodiment, the light-emitting unit can be filled with the fluid material while the air bubbles inside the light-emitting unit are being discharged efficiently to the outside thereof. Thus, the light-emitting unit having high thermal exhaust performance can be manufactured in a simpler manner.

It is to be noted that any arbitrary combination of the above-described structural components and processing steps and expressions changed between a method, an apparatus, a system and so forth are all effective as and encompassed by the present embodiments.

Moreover, this summary of the invention does not necessarily describe all necessary features so that the invention may also be sub-combination of these described features.

DETAILED DESCRIPTION OF THE INVENTION

The invention will now be described based on the following embodiments which do not intend to limit the scope of the present invention but exemplify the invention. All of the features and the combinations thereof described in the embodiments are not necessarily essential to the invention.

A light-emitting unit according to the present embodiments has silicone filled in its casing, which is free from air or air bubbles remaining therewithin. This internal condition ensures a high thermal conductivity from the inside of the casing to the outside, thereby releasing the heat arising from light-emitting elements and substrate to the outside efficiently.

Figure 1:
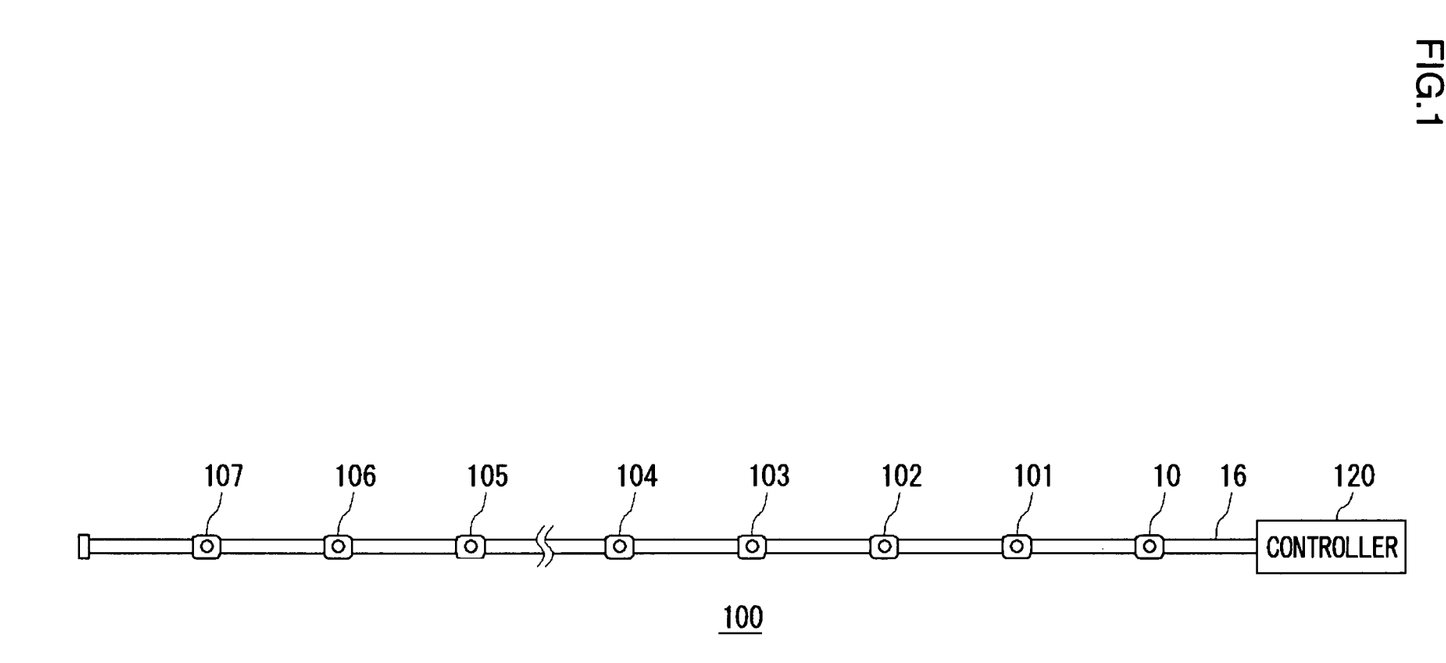
FIG. 1 shows a structure of an illuminating apparatus wherein a plurality of light-emitting units are connected.

FIG. 1 shows a structure of an illuminating apparatus wherein a plurality of light-emitting units are connected. The illuminating apparatus shown in FIG. 1 is what is called "tape light", an outdoor or indoor decorative illumination used in commercial spaces. An illuminating apparatus 100 comprises a controller 120, a cable 16 for supplying power and a plurality of light-emitting units. The plurality of light-emitting units shown in FIG. 1 are light-emitting units 10, 101, 102, 103, 104, 105, 106 and 107 (hereinafter referred to generically as "the plurality of light-emitting units 10 and others").

The cable 16 is, for example, a cable about 20 meters long, formed in a flat tape-like structure containing four conductors disposed in parallel with one another with a resin member covering them. The light-emitting units are connected to the cable 16 and provided thereon at predetermined intervals of about 10 cm for instance. The controller 120 is connected to one end of the power supply cable 16, and electric power is supplied to each of the plurality of light-emitting units 10 and others from the controller 120 via the cable 16.

The plurality of light-emitting units 10 and others are each provided with three color LEDs corresponding to the three primary colors RGB (red, green and blue) and emit light according to the power supply and control from the controller 120. At this time, the three color LEDs emit light with different intensities according to the voltages applied thereto and can also realize full-color light emission through a combination of the intensities of the three colors. The plurality of light-emitting units 10 and others provided on the cable 16 emit light of the same color under the control from the controller 120. The controller 120 changes the emission color gradually by changing the duty ratio and/or phase of the voltage to be applied to each of the LEDs.

Figure 2:
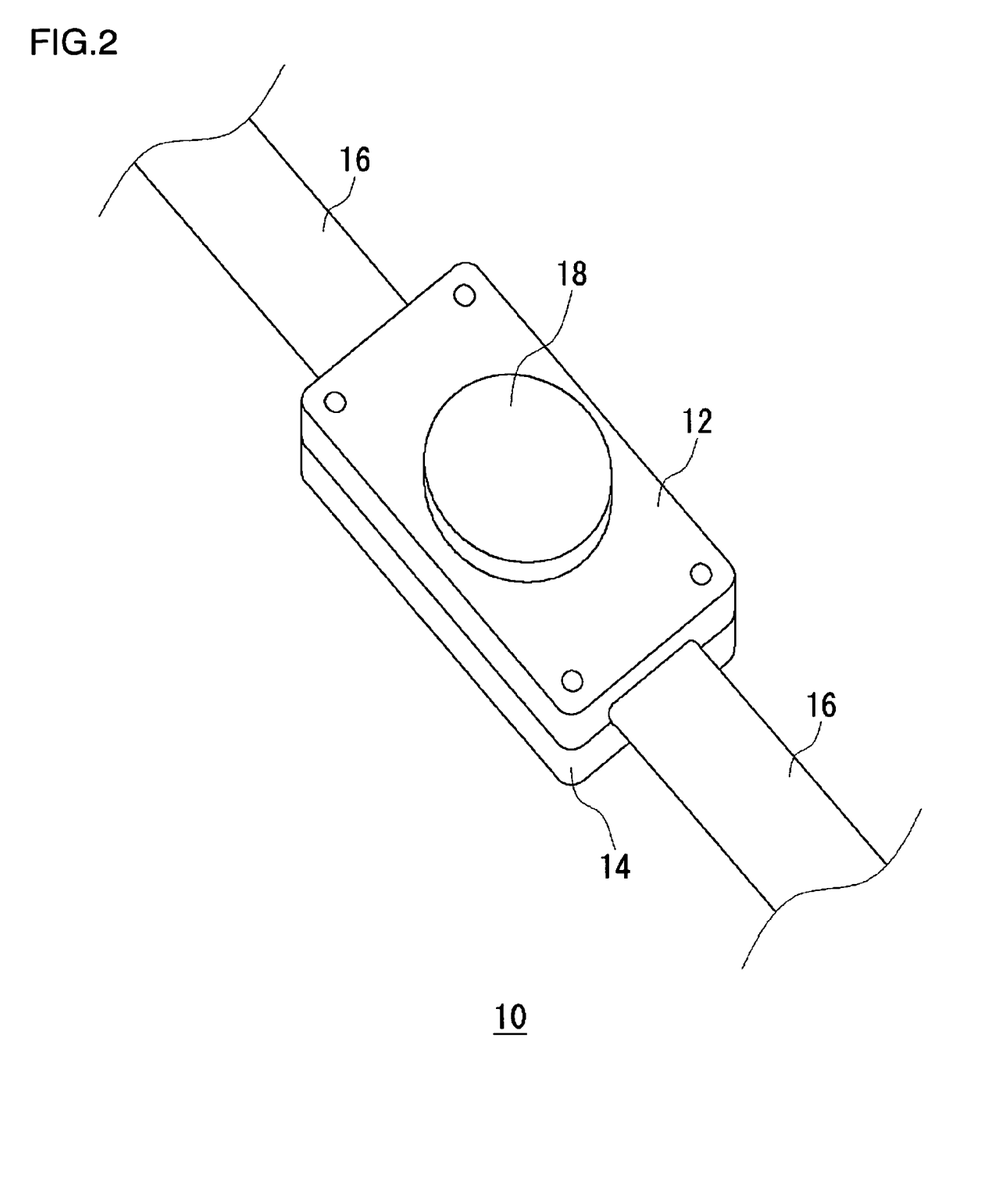
FIG. 2 is a perspective view of a light-emitting unit seen from above.

FIG. 2 is a perspective view of a light-emitting unit 10 seen from above. The light-emitting unit 10 includes a first member 12 and a second member 14. The first member 12 and the second member 14 are joined together in a mutually engaged manner such that a hollow area is formed in between them. In the hollow area formed between the first member 12 and the second member 14, a substrate with light-emitting elements mounted thereon is disposed and held fixedly between the first member 12 and the second member 14. A cable 16 is connected to the substrate and led out through insertion openings provided in the two opposite sides of the light-emitting unit 10. As has been described, the first member 12 and the second member 14 constitute a casing for the light-emitting unit, which covers the substrate with light emitting elements, such as LEDs, mounted thereon. A translucent part 18, which is provided on top of the first member 12, lights up with light emitted by the LEDs. This light-emitting unit 10 has silicone filled in its casing as a waterproofing measure when it is installed outdoors and thus exposed to rain and/or snow. The silicone covers and seals the conducting parts, such as LEDs and substrate, within the light-emitting unit 10, thus preventing the entry of rainwater or the like.

Figure 3:
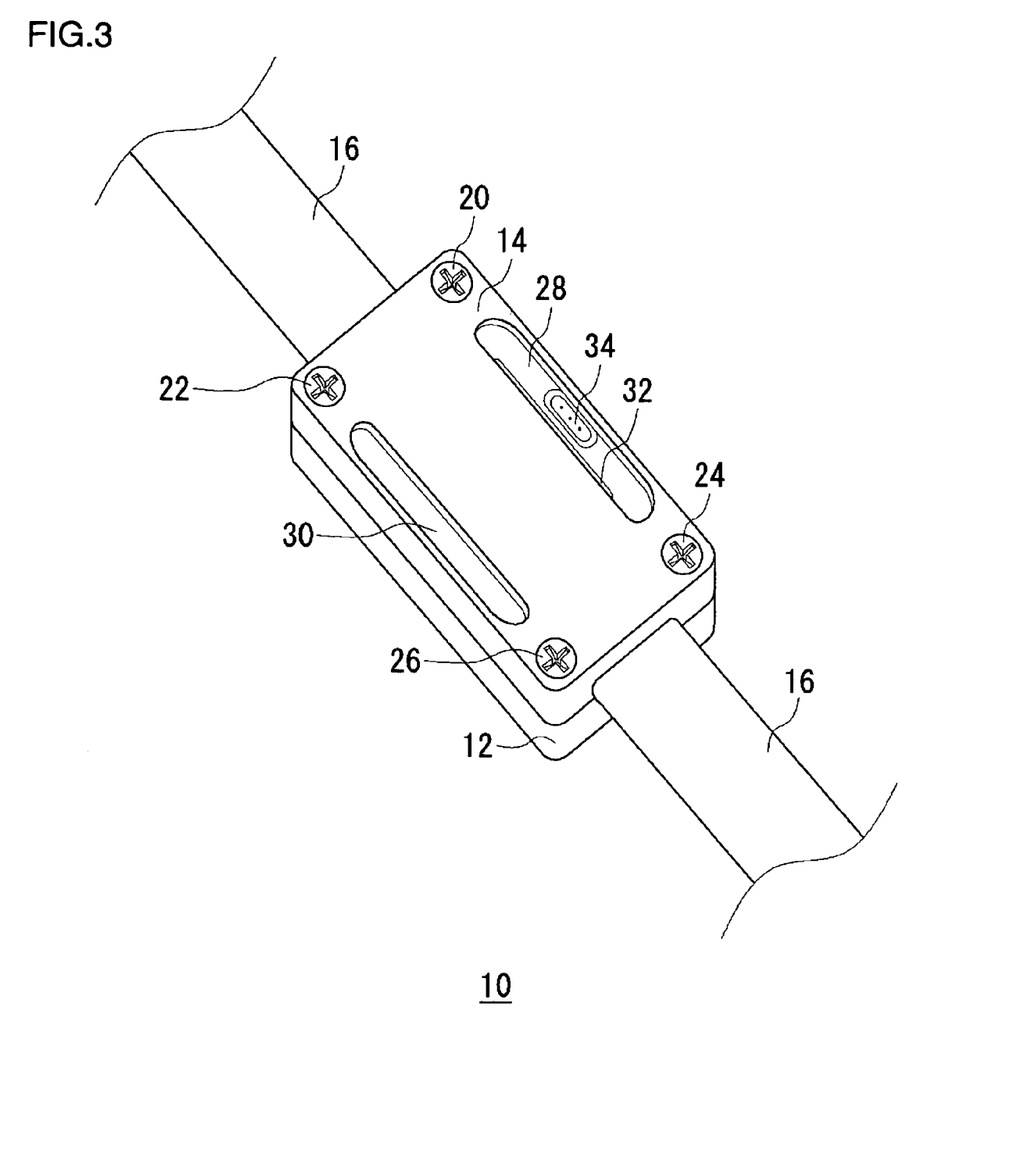
FIG. 3 is a perspective view of an inverted light-emitting unit seen from above.

FIG. 3 is a perspective view of an inverted light-emitting unit 10 seen from above. The second member 14 is secured to the first member 12 with screws 20, 22, 24 and 26. There are concaves 28 and 30 provided in the outer surface of the second member 14. In part of the bottom of the concave 28, an injection opening 34 and a discharge opening 32 are provided. A structure is such that silicone is injected from the injection opening 34 and, when the silicone fills up the light-emitting unit 10, excess part of the silicone will flow out of the discharge opening 32. As shown in FIG. 3, the injection opening 34 and the discharge opening 32 are not located on the top side but on the back side of the light-emitting unit 10. Therefore, injection of silicone is carried out with the light-emitting unit 10 secured upside down as shown in FIG. 3.

Figure 4:
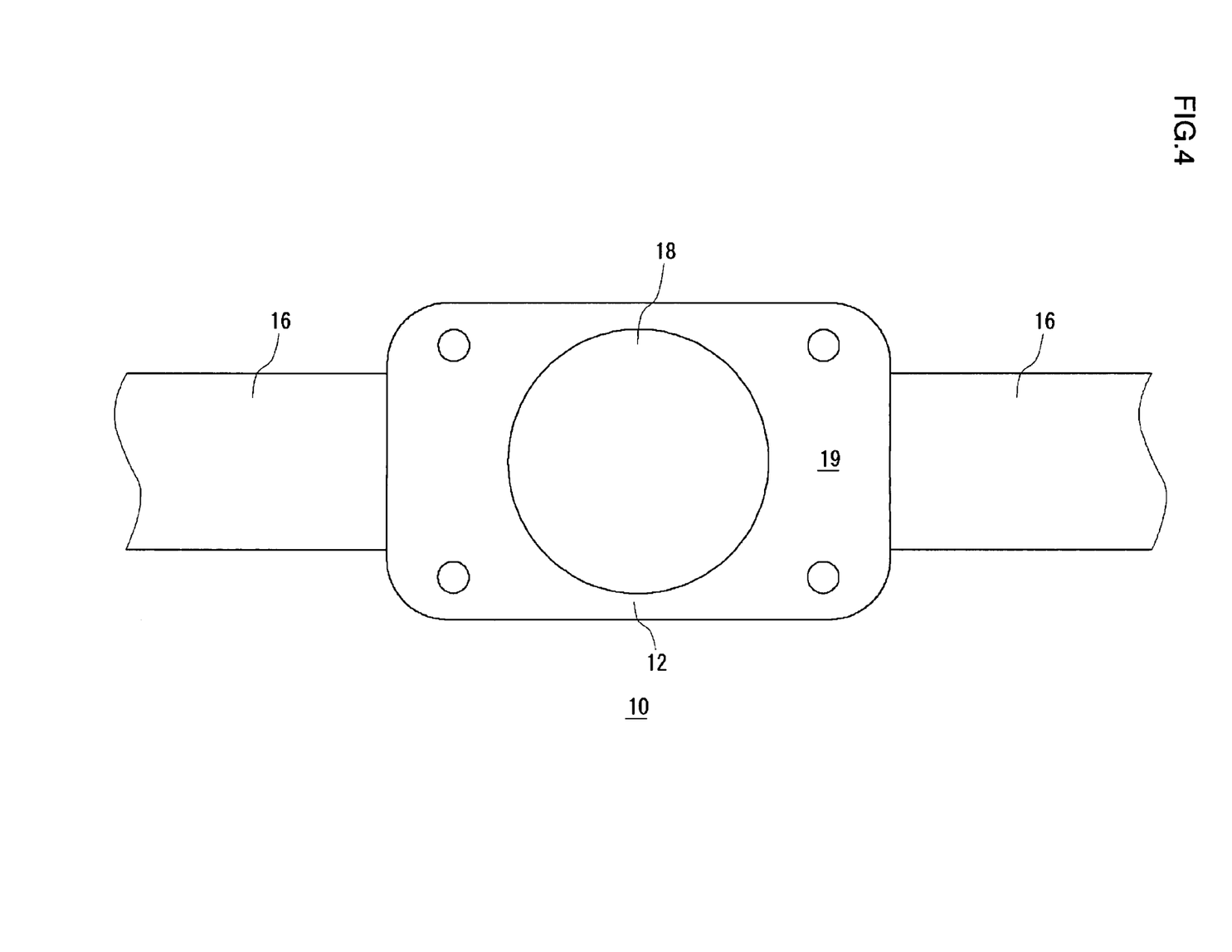
FIG. 4 is a top view of a light-emitting unit.

FIG. 4 is a top view of a light-emitting unit 10. A first member 12 seen in the top view of the light-emitting unit 10 has an outer surface 19 which is approximately rectangular with rounded corners, and a circular translucent part 18 is provided approximately in the center of the outer surface 19. The translucent part 18 is formed with a nearly transparent material so that light emitted by the LEDs in the light-emitting unit 10 can pass through. A cable 16, penetrating the light-emitting unit 10, is led out of the two opposing sides thereof.

Figure 5:
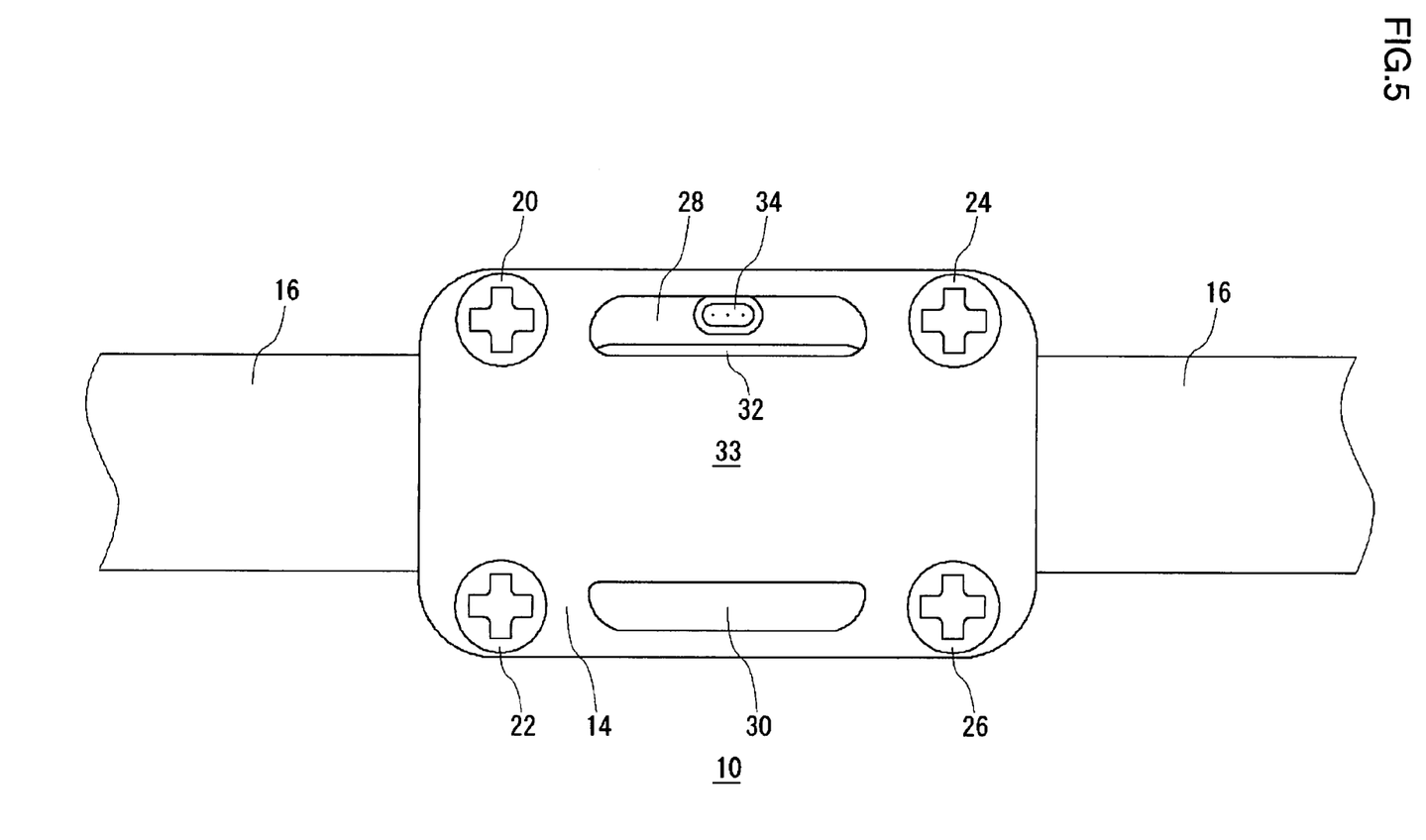
FIG. 5 is a view of a light-emitting unit seen from the bottom side.

FIG. 5 is a view of a light-emitting unit 10 seen from the bottom side. Similar to the first member 12, the second member 14 also has an outer surface 33 which is approximately rectangular with rounded corners. Screws 20, 22, 24 and 26 are inserted into the threaded holes provided in the four corners of the outer surface 33. A concave 28 is provided in a longitudinally long form between screws 20 and 24, whereas a concave 30 is provided in a longitudinally long form between screws 22 and 26. The discharge opening 32 is provided in part of the bottom of the concave 28 in a slit form about the same length as that of the concave 28. An injection opening 34 is provided in the bottom of the concave 28 in an elliptical form whose major axis is shorter than the length of the discharge opening 32. The concave 28 is so designed that the silicone overflowing from the discharge opening 32 can stay therewithin. A concave 30, which is a concave of the same shape as the concave 28, has no silicone injection or discharge opening provided. It is provided in a position symmetrical to the concave 28 for the sole purpose of decorative beauty.

The discharge opening 32 is formed to have an opening area larger than that of the injection opening 34. As silicone is injected from the injection opening 34, pressure is created from the injection opening 34 toward the discharge opening 32 and as a result the silicone flows in that direction. Together with the flow of the silicone, air or air bubbles within the light-emitting unit 10 will be discharged outside. If the silicone solidifies with air bubbles remaining near the substrate, the heat generated from the substrate may cause the air bubbles to expand and inflict harm on the electronic parts, such as peeling solder from the substrate. In contrast, the present embodiment can accomplish easy removal of air bubbles, thus improving the reliability of the product. Moreover, since silicone has a higher thermal conductivity than air, the heat generated from the substrate or light-emitting elements can be efficiently conducted through the silicone to the first member 12 and the second member 14. In fact, the thermal conductivity of silicone is approximately 0.15 W/mK, higher by one order than that of air, which is approximately 0.024 W/mK. According to the present embodiment, therefore, the heat emission performance of the light-emitting unit 10 is raised by the silicone that is filled in. It should be understood in addition that a negative pressure may be applied from the discharge-opening side by suction or similar means in order to further raise the pressure from the injection opening 34 toward the discharge opening 32.

Figure 6:
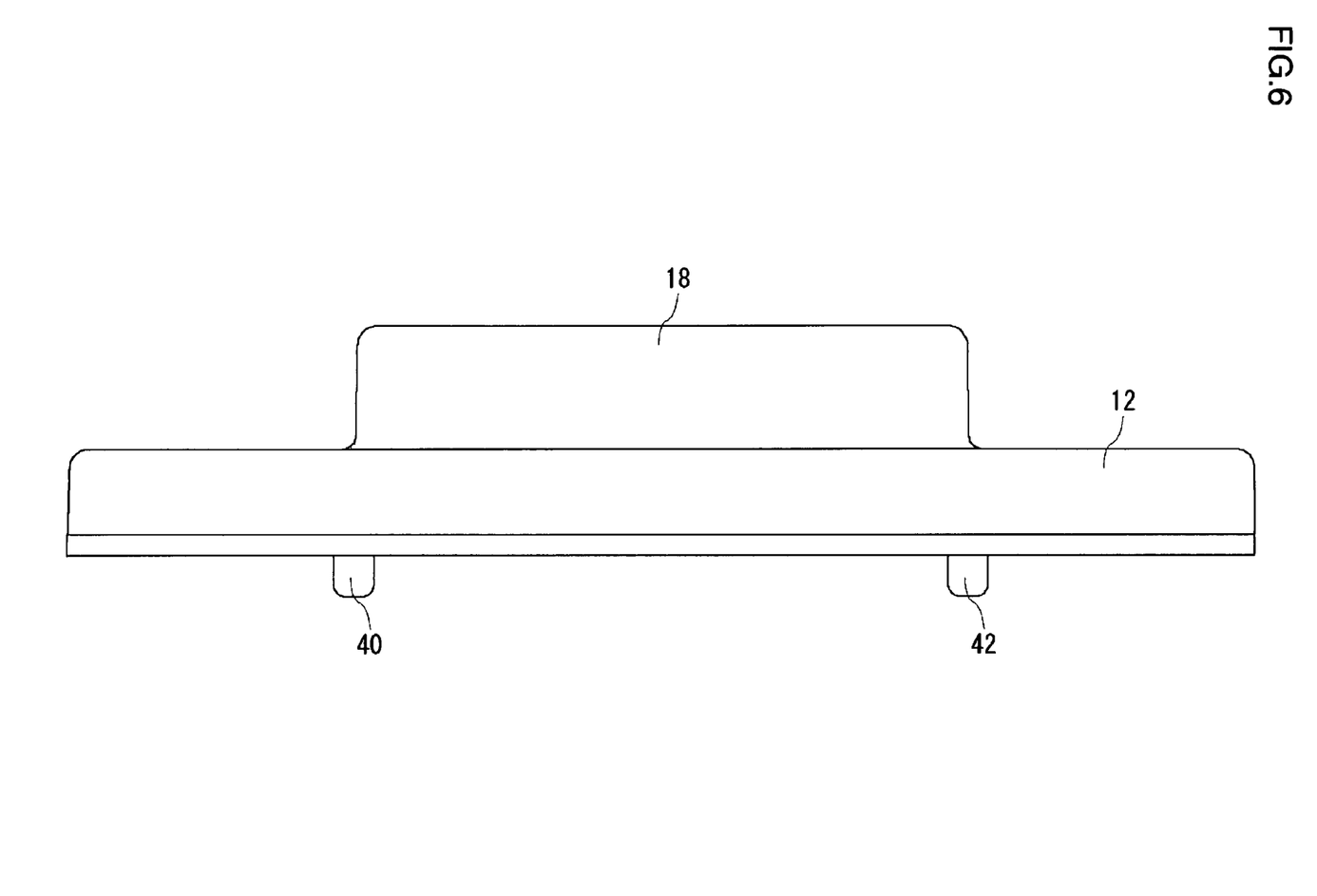
FIG. 6 is a side view of a first member seen from the front.

FIG. 6 is a side view of a first member 12 seen from the front. On the bottom of the first member 12, there are provided projections 40 and 42, which will engage with the second member 14. The translucent part 18 is formed in such a way as to rise above the first member 12.

Figure 7:
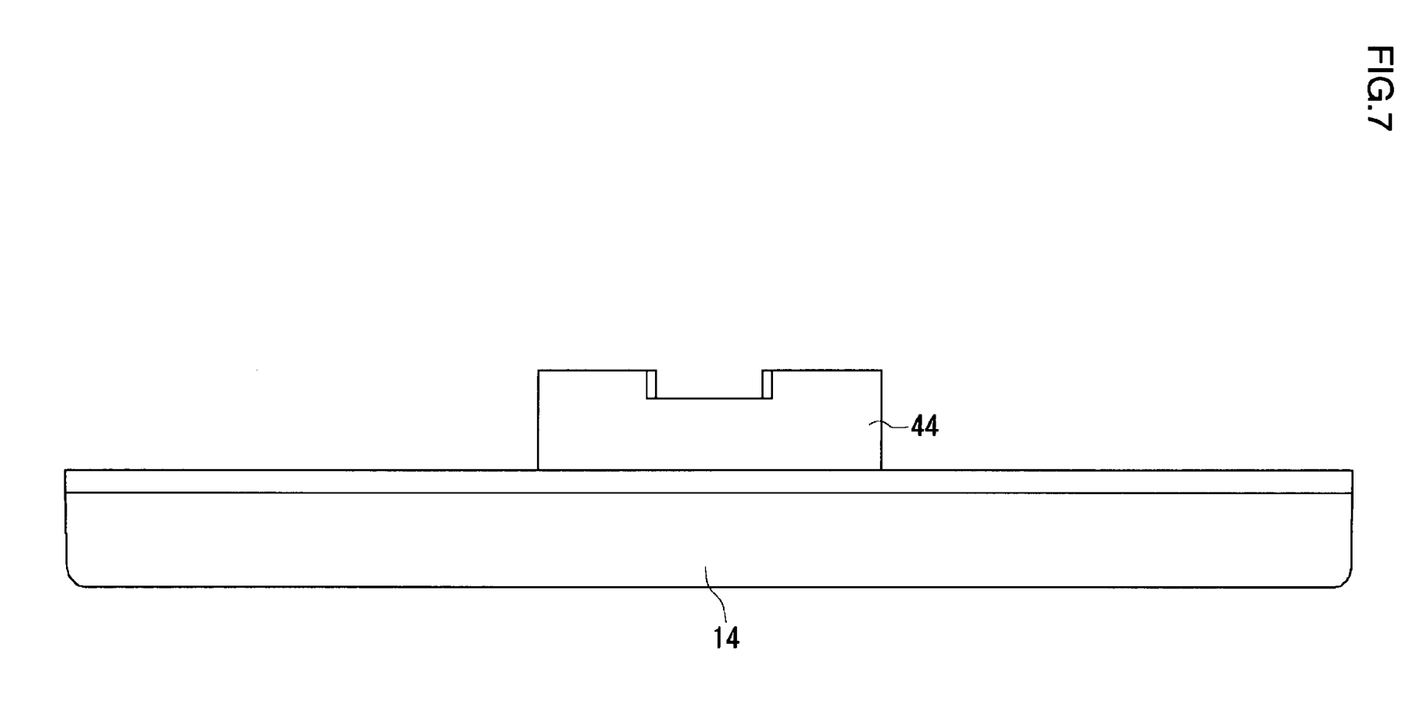
FIG. 7 is a side view of a second member seen from the front.

FIG. 7 is a side view of a second member 14 seen from the front. On the top of the second member 14, there is provided a projecting piece 44, which will engage with the first member 12. A passage for silicone injection is formed inside the projecting piece 44.

Figure 8:
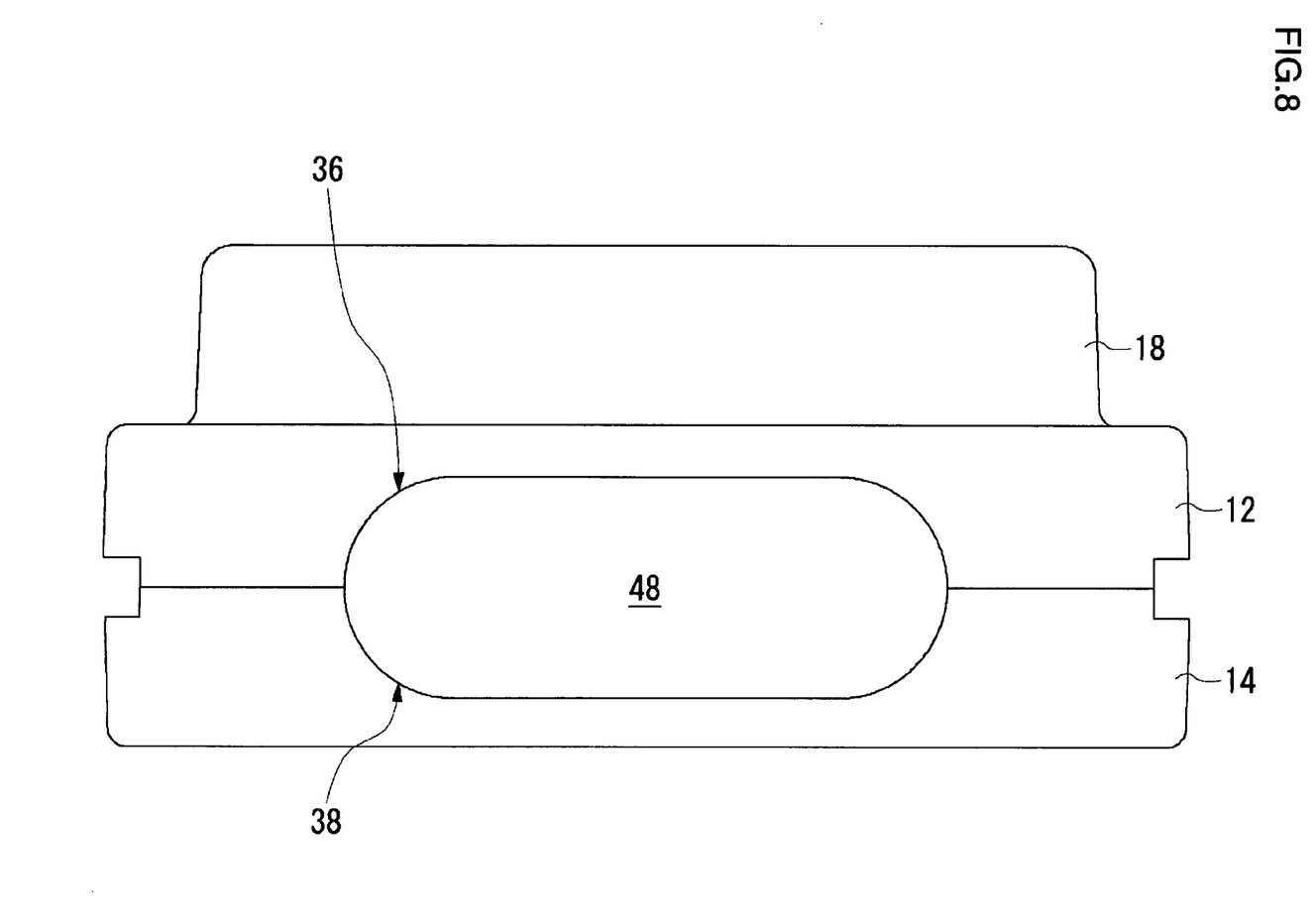
FIG. 8 is a side view of a first member and a second member joined together.

FIG. 8 is a side view of a first member 12 and a second member 14 joined together. A first groove 36, which is in a transversely long form, is provided in the side of the first member 12. Likewise, a second groove 38, which is in a transversely long form, is provided in the side of the second member 14. The first groove 36 and the second groove 38, when the first member 12 and the second member 14 are joined together, form an insertion opening 48. A cable 16 led out from the light-emitting unit 10 through this insertion opening 48. Similarly, on the opposite side not shown, the grooves are provided in both the first member 12 and second member 14 to form the insertion opening, through which a cable 16 is led out.

Figure 9:
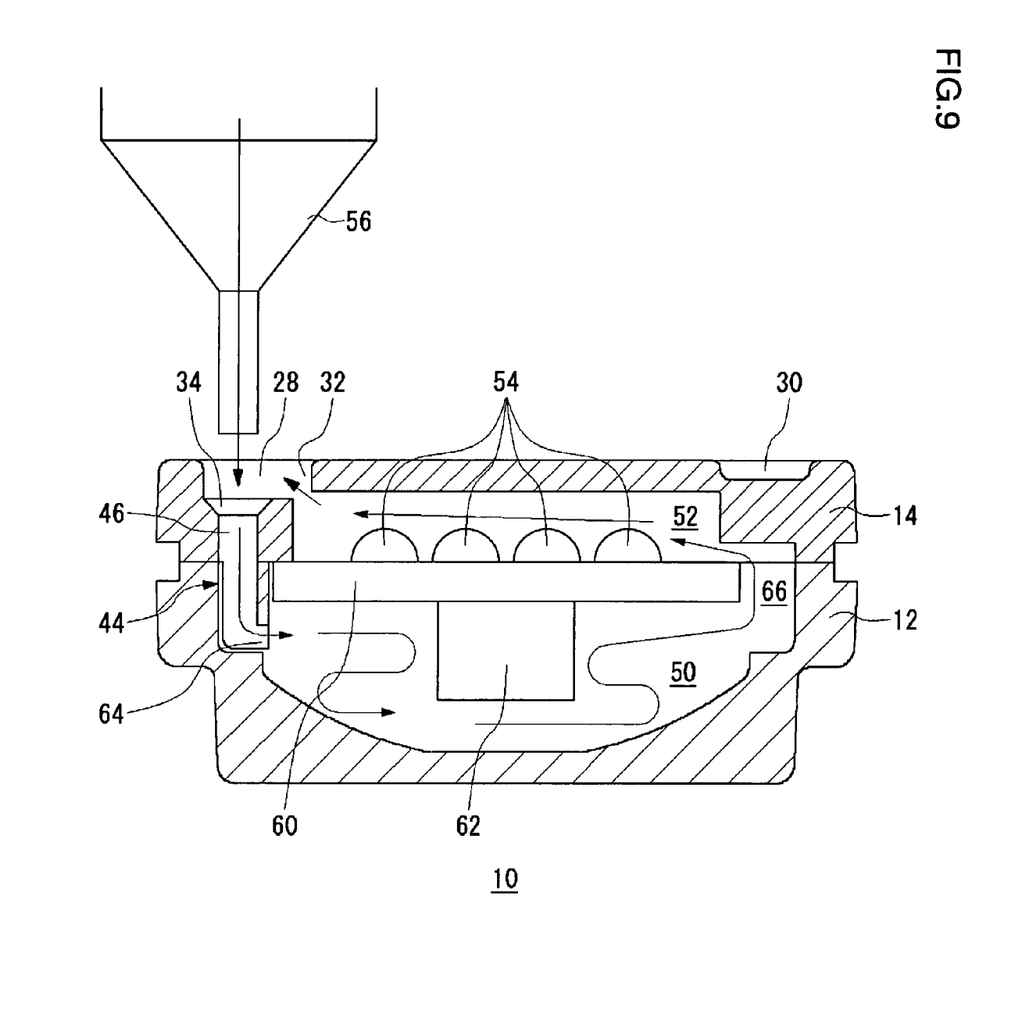
FIG. 9 is a cross-sectional view showing how silicone is injected into a light-emitting unit.

FIG. 9 is a cross-sectional view showing how silicone is injected into a light-emitting unit 10. This is a cross-sectional view seen from the side of the light-emitting unit 10 with the first member 12 and the second member 14 joined together. When silicone is injected, the light-emitting unit 10 is turned over and secured with the second member 14 placed above the first member 12. The substrate 60 is held between the first member 12 and the second member 14. The first member 12 and the second member 14 have approximately dish-shaped dent formed on their mutually opposing sides so as to form a hollow area in which the substrate 60 can be positioned. LEDs 62 as light-emitting elements are mounted on the top side of the substrate 60. Inside the light-emitting unit 10, the cable 16 passing through it is stripped of the resin cover to expose the four conductors, and the four conductors are connected with solder 54 to the back side of the substrate 60.

The hollow area formed between the first member 12 and the second member 14 is divided into a first-member side hollow 50 and a second-member side hollow 52 with the substrate 60 as the boundary. The projecting piece 44 is inserted into the internal side of the first member 12, and the top of the projecting piece 44 is positioned at an end of the first-member side hollow 50. The inside of the projecting piece 44 has a passage 46 so formed as to penetrate it from near the top thereof to the bottom thereof, and the passage 46 connects and communicates the first-member side hollow 50 with the outside of the light-emitting unit 10. The discharge opening 32 is provided in the position adjacent to the second-member side hollow 52, and the concave 28 and the second-member side hollow 52 are connected with each other via the discharge opening 32. The first-member side hollow 50 and the second-member side hollow 52 are connected with each other via a connecting passage 66. The connecting passage 66, which is a gap between the substrate 60 and the first member 12, is formed in the position symmetrical to the position where the projecting piece 44 is inserted, with the substrate as the center.

Now, a process for injecting silicone into a light-emitting unit 10 will be described below. The first member 12 and the second member 14 are first joined together and secured with the screws or the like. Then the tip of an injector 56 is inserted into the injection opening 34, and injection of silicone into the injection opening 34 from the injector 56 is started. The silicone injected through the injection opening 34 flows through the passage 46 and fills the first-member side hollow 50. From there, the silicone passes through the connecting passage 66 and fills the second-member side hollow 52. In this process, air that has been filling the inside of the first-member side hollow 50 and the second-member side hollow 52 is pushed out by the advancing silicone and discharged outside through the discharge opening 32. Along with the flow of the silicone, air bubbles which may be formed therewithin are also carried toward the discharge opening 32.

Now, the silicone that has filled up the passage 46, the first-member side hollow 50, the connecting passage 66 and the second-member side hollow 52 will begin overflowing from the discharge opening 32. Injection of silicone is stopped at the point when the silicone begins overflowing from the discharge opening 32. The silicone that has overflowed from the discharge opening 32 remains within the concave 28, and as it is left standing, the air bubbles that have occurred in the light-emitting unit 10 will float up to the concave 28 and escape into the outside. And the state of the silicone remaining within the concave 28 and air bubbles floating up through the silicone can easily be observed and monitored from outside until the inside of the light-emitting unit 10 is completely purged of air bubbles. Then the silicone is allowed to dry up, and the process of silicone injection comes to an end when it has solidified. Thus, within a narrow space containing the substrate 60, LEDs 62, solder 54 and so forth, the silicone flows through the predetermined course of the injection opening 34, the passage 46, the first-member side hollow 50, the connecting passage 66, the second-member side hollow 52 and the discharge opening 32. That is, the silicone flows through, in a predetermined direction, in this order of the injection opening 34, the passage 46, the first-member side hollow 50, the connecting passage 66, the second-member side hollow 52 and finally the discharge opening 32. Thus, the present embodiment is capable of discharging air or air bubbles outside quite easily.

The wiring provided on the back surface of the substrate 60 is connected to the wiring provided on the top surface thereof by way of through holes or via holes. This structure works as a kind of thermal via in which the heat generated on the top surface of the substrate 60 and the heat emitted from the LEDs 62 are conducted to the back side of the substrate 60. On the bottom surface of the substrate 60, solder 54 is deposited to connect the wiring on the bottom surface to the conductors in the cable 16. And this solder 54 is deposited in such a way as to have a relatively large bulge and therefore a wide heat radiation area. Accordingly, the heat conducted from the top to the bottom of the substrate 60 is further conducted to the silicone inside the second-member side hollow 52 by way of the solder 54 and then released to the outside. In this manner, the heat generated within the light-emitting unit 10 is discharged outside efficiently from both the top and bottom sides of the substrate 60. Thus, the present embodiments have an excellent heat discharge performance.

The present invention has been described based on the embodiments which are only exemplary. It is understood by those skilled in the art that there exist other various modifications to the combination of each component and process described above and that such modifications are encompassed by the scope of the present invention.

The embodiments of the present invention have been described by taking silicone as an example of fluid material. In a modified example, however, an epoxy resin may be used as the fluid material. It is to be noted, however, that silicone, with its elasticity and lower degradability, may be more advantageous than epoxy resins, which tend to be hard, fragile and degradable. While silicone shows a weakness in its susceptibility to dirt or contamination, the one to be contained in the casing as in the present embodiments is exempted from this problem. In this sense, too, the light-emitting unit 10 according to the present embodiments herein provides a significant advantage.

Although the present invention has been described by way of exemplary embodiments, it should be understood that many changes and substitutions may further be made by those skilled in the art without departing from the scope of the present invention which is defined by the appended claims.

What is claimed is:

1. A casing, for use with light-emitting unit, that covers over a substrate with light emitting elements mounted thereon, the casing constituted by a first member and a second member which fixedly hold the substrate therebetween and which are approximately dish-shaped and are joined together in a mutually engaged manner such that a hollow area in which the substrate is disposed is formed therebetween, wherein said second member has a projecting piece inserted to said first member and inside the projecting piece there is formed a passage that penetrates from near a top thereof to a bottom thereof so as to communicate the hollow area with the outside of the casing, wherein at a position where the passage is connected to the outside of the casing there is formed an injection opening to inject fluid material to the hollow area via the passage, wherein in the vicinity of the injection opening there is provided a discharge opening to discharge the injected fluid material from the hollow area, wherein, in a state where said second member and said first member are being joined together and mutually engaged therewith, the hollow area is divided into a first-member side space and a second-member side space with the substrate as a boundary therebetween, and a tip of the projecting piece is disposed in the first-member side space whereas the discharge opening is disposed near the second-member side space, and wherein the hollow area is formed in a shape such that the fluid material injected from the injection opening flows from the first-member side space through the second-member side so as to be discharged from the discharge opening.

2. A casing for use with light-emitting unit according to claim 1, wherein said first member is a member positioned in an upper side of the casing for use with light-emitting unit when in use and said first member has a substantially transparent area through which light emitted from the light emitting element transmits and wherein said second member is a member positioned in a back side of the casing for use with light-emitting unit when in use and the injection opening is provided at a position not on the upper side thereof when in use.

3. A casing for use with light-emitting unit according to claim 1, wherein there is provided a concave on an outer surface of the second member and there is provided a discharge opening in part of a bottom face of the concave.

4. A casing for use with light-emitting unit according to claim 2, wherein there is provided a concave on an outer surface of the second member and there is provided a discharge opening in part of a bottom face of the concave.

5. A casing for use with light-emitting unit according to claim 1, wherein the discharge opening is formed in such a manner that an opening area of the discharge opening is larger than that of the injection opening.

6. A casing for use with light-emitting unit according to claim 2, wherein the discharge opening is formed in such a manner that an opening area of the discharge opening is larger than that of the injection opening.

7. A casing for use with light-emitting unit according to claim 3, wherein the discharge opening is formed in such a manner that an opening area of the discharge opening is larger than that of the injection opening.

8. A casing for use with light-emitting unit according to claim 4, wherein the discharge opening is formed in such a manner that an opening area of the discharge opening is larger than that of the injection opening.

9. A casing for use with light-emitting unit according to claim 1, wherein the fluid material is silicone.

10. A casing for use with light-emitting unit according to claim 2, wherein the fluid material is silicone.

11. A casing for use with light-emitting unit according to claim 3, wherein the fluid material is silicone.

12. A casing for use with light-emitting unit according to claim 4, wherein the fluid material is silicone.

13. A casing for use with light-emitting unit according to claim 5, wherein the fluid material is silicone.

14. A casing for use with light-emitting unit according to claim 6, wherein the fluid material is silicone.

15. A casing for use with light-emitting unit according to claim 7, wherein the fluid material is silicone.

16. A casing for use with light-emitting unit according to claim 8, wherein the fluid material is silicone.

* * * * *